US008786360B2

(12) United States Patent
Ang

(10) Patent No.: US 8,786,360 B2
(45) Date of Patent: Jul. 22, 2014

(54) CIRCUIT AND METHOD FOR FAST SWITCHING OF A CURRENT MIRROR WITH LARGE MOSFET SIZE

(75) Inventor: Justin Ang, Singapore (SG)

(73) Assignee: STMicroelectronics Asia Pacific PTE, Ltd., Singapore (SG)

( * ) Notice: Subject to any disclaimer, the term of this patent is extended or adjusted under 35 U.S.C. 154(b) by 1076 days.

(21) Appl. No.: 11/679,364

(22) Filed: Feb. 27, 2007

(65) Prior Publication Data

US 2007/0210858 A1 Sep. 13, 2007

(30) Foreign Application Priority Data

Mar. 7, 2006 (SG) ................................ 200601485-6

(51) Int. Cl.

| | |
|---|---|
| ***H03B 1/00*** | (2006.01) |
| ***H03K 3/00*** | (2006.01) |
| ***H03K 17/04*** | (2006.01) |
| ***G11C 5/14*** | (2006.01) |
| ***G05F 1/10*** | (2006.01) |
| ***G05F 3/02*** | (2006.01) |
| ***G05F 3/26*** | (2006.01) |

(52) U.S. Cl.
CPC ...................................... *G05F 3/262* (2013.01)
USPC ........... 327/543; 327/108; 327/374; 327/530; 327/538; 327/545; 327/546

(58) Field of Classification Search
USPC ......... 327/108, 109, 131, 132, 332, 374, 530, 327/538, 543, 545, 546; 323/313, 314
See application file for complete search history.

(56) References Cited

U.S. PATENT DOCUMENTS

| | | | | |
|---|---|---|---|---|
| 5,404,053 A * | 4/1995 | Poma et al. | 327/108 |
| 5,969,549 A * | 10/1999 | Kim et al. | 327/143 |
| 6,052,006 A | 4/2000 | Talaga et al. | |
| 6,194,955 B1 * | 2/2001 | Ishida | 327/538 |
| 6,351,158 B1 * | 2/2002 | Shearon et al. | 327/108 |
| 7,116,174 B2 * | 10/2006 | Fang et al. | 330/296 |
| 7,307,460 B2 * | 12/2007 | Robinson et al. | 327/148 |
| 2005/0174099 A1 | 8/2005 | Ohkubo et al. | |
| 2006/0132208 A1 * | 6/2006 | Park | 327/182 |

FOREIGN PATENT DOCUMENTS

JP 10143264 A * 5/1998

* cited by examiner

*Primary Examiner* — Lincoln Donovan
*Assistant Examiner* — Colleen O Toole
(74) *Attorney, Agent, or Firm* — Hogan Lovells US LLP

(57) ABSTRACT

The present invention discloses a fast switching current mirror circuit and method for generating fast switching current. The circuit and method for fast switching of a current mirror with large MOSFET size will save space and current consumption.

13 Claims, 2 Drawing Sheets

CIRCUIT AND METHOD FOR FAST SWITCHING OF A CURRENT MIRROR WITH LARGE MOSFET SIZE

RELATED APPLICATION

The present application claims priority of Singapore Application No. 200601485-6 filed Mar. 7, 2006, which is incorporated herein in its entirety by this reference.

FIELD OF THE INVENTION

The present invention generally relates to electronic circuits for DC power supplies that require fast switching current mirrors, and more particularly to a fast switching current mirror circuit with a large size MOSFET and a method for fast switching the current mirror circuit.

BACKGROUND OF THE INVENTION

Switch-mode regulators are widely used to supply power to electronic devices such as portable devices (e.g., PDA, MP3 player), computers, printers, telecommunication equipment, and other devices. Such switch-mode regulators are available in variety of configurations for producing the desired output voltage or current from a source voltage to power a load such as microprocessors of portable devices. The drive circuit is a current mirror, mirroring a fixed current, which is N times from a reference current.

FIG. 1 shows the schematic diagram of a simple current mirror circuit that has a large PFET providing a large output current of 50 mA at M0 to power a load. When CLK=0, the gate voltage of M0 is pulled high (up to VCC) to switch off the output current Io. When CLK=1, the gate of M0 is connected to the biasing voltage of M1. Because the size of M0 is of large width, there is a large current to be sunk before the voltage of the gate terminal of M0 reaches the biasing voltage of M1. Here, M1 is sized about 1/100 of M0 so that the sink current of M4 is large enough to pull down the gate of M0 to the biased voltage to match the switching frequency of the clock. If the sink current is not large enough, the gate voltage will require more time to reach the biased voltage. However, this design consumes much space and current.

FIG. 2 shows the schematic diagram of another current mirror circuit that is similar to the one shown in FIG. 1. This circuit comprises a buffer amplifier and a smaller sink transistor. The buffer amplifier limits the current discharged from the gate terminal of M0 when the CLK=1. Thus, the current sink flowing through M4 is reduced from 500 μA to 50 μA, which is ten times less than the current sink of FIG. 1. However, the buffer amplifier requires space and biasing current.

With progressing miniaturization of electronic devices and increasing speed of operation, there is an imperative need for a current circuit with less space, less power consumption and fast switching speed so that it is suitable for being employed in switching regulators.

SUMMARY OF THE INVENTION

In one embodiment of the present invention, there is provided a fast switching current mirror circuit for providing a fast-switched large current. In the embodiment, the fast switching current mirror comprises an output transistor that is a large size to source a large current output; a current source configured to provide a mirrored current as a reference bias current to the output transistor; a first current mirror electrically coupled to the gate terminal of the output transistor, wherein the first current mirror is so configured that it provides the biasing voltage to the gate terminal of the output transistor; a feedback sub-circuit electrically coupled to the first current mirror, wherein the feedback sub-circuit is so configured that it will receive the feedback signal from the first current mirror to sink the current from the gate terminal of the output transistor; and a second current mirror electrically coupled to the output transistor, the current source, the first current mirror, and the feedback sub-circuit, wherein the second current mirror is so configured that it provides the current source to the output transistor and sinks the residual current from the gate terminal of the output transistor when its gate terminal is at the biasing voltage. In another embodiment, the fast switching current mirror circuit further comprises a first and a second clock switches for controlling the gate voltages of the output transistor.

In another embodiment of the fast switching current mirror circuit, the output transistor is a PFET, wherein its source terminal is electrically coupled to a power supply, and its drain terminal to an input of the output current; wherein the first clock switch is electrically disposed between the power supply and the gate terminal of the output transistor; when the first clock switch is on, the output transistor is turned off for its gate voltage is pulled up to the power supply; and wherein the second clock switch is electrically disposed between the first current mirror and the gate terminal of the output transistor; when the second clock switch is on, the output transistor is turned on for its gate voltage is pulled down to the biasing voltage of the first current mirror; whereby the first and second clock switches form a complementary switch pair, i.e., whenever the first (second) is open, the second (first) is closed.

In another embodiment of the fast switching current mirror circuit, wherein the first current mirror comprises a biasing transistor and a feedback transistor; wherein the biasing transistor and feedback transistor are PFET; wherein the source terminals of both transistors are electrically coupled to the power supply, the gate terminals to each other, the drain terminals to the second current mirror; and wherein the drain and gate terminals of the biasing transistor are electrically connected so that when the second switch is on, the pulled-up biasing voltage at the drain terminal of the biasing transistor will turn off the feedback transistor that in turn turns on the feedback sub-circuit to sink the current and pull down the biasing voltage.

In another embodiment of the fast switching current mirror circuit, the feedback sub-circuit comprises a draining transistor that is an NMOS, and an inverter; wherein the inverter is electrically coupled to the drain terminal of the feedback transistor and the gate terminal of the draining transistor; the draining terminal of the draining transistor is electrically coupled to the biasing voltage; and the source terminal to the ground; and wherein, when the second clock switch is on, the feedback transistor is turned off, then the low input of the inverter will turn on the draining transistor until the biasing voltage is pulled down enough to turn on the feedback transistor again.

In another embodiment of the fast switching current mirror circuit, the second current mirror comprises a first NMOS, a second NMOS, and a third NMOS forming a current mirror; wherein, for the first NMOS, its drain terminal is electrically coupled to the current source, its source terminal to the ground, and its gate terminal to the gate terminals of the second and third NMOSs; the drain and gate terminals of the first NMOS are electrically connected, forming a diode configuration; wherein, for the second NMOS, its drain terminal is electrically coupled to the drain terminal of the feedback transistor, and its source terminal to the ground; and wherein, for the third NMOS, its drain terminal is electrically coupled to the drain terminal of the biasing transistor, its source terminal to the ground for draining any current from the gate terminal of the output transistor.

In another embodiment of the present invention, there is provided a switching regulator for providing a fast-switched large current to a load. In the embodiment, the switching regulator comprises an electronic means for channeling a fast-switched large current to the load; and a fast switching current mirror circuit for providing the fast-switched large current; wherein the fast switching current mirror circuit is electrically coupled to a clock control and the electronic means so that, when the circuit receives the clock control signals, it will provide the electronic means with the fast-switched large current; wherein the fast switching current mirror circuit comprises: an output transistor that is a large size to source a large current output; a current source for providing a mirrored current as a reference bias current to the output transistor; a first current mirror electrically coupled to the gate terminal of the output transistor, wherein the first current mirror is so configured that it provides the biasing voltage to the gate terminal of the output transistor; a feedback sub-circuit electrically coupled to the first current mirror, wherein the feedback sub-circuit is so configured that it will receive the feedback signal from the first current mirror to sink the current from the gate terminal of the output transistor; and a second current mirror electrically coupled to the output transistor, the current source, the first current mirror, and the feedback sub-circuit, wherein the second current mirror is so configured that it provides the current source to the output transistor and sinks the residual current from the gate terminal of the output transistor when its gate terminal is at the biasing voltage. In another embodiment, the switching regulator further comprises a first and a second clock switches for controlling the gate voltages of the output transistor.

In another embodiment of the switching regulator, the output transistor is a PFET, wherein its source terminal is electrically coupled to a power supply, and its drain terminal to an input of the output current; wherein the first clock switch is electrically disposed between the power supply and the gate terminal of the output transistor; when the first clock switch is on, the output transistor is turned off for its gate voltage is pulled up to the power supply; and wherein the second clock switch is electrically disposed between the first current mirror and the gate terminal of the output transistor; when the second clock switch is on, the output transistor is turned on for its gate voltage is pulled down to the biasing voltage of the first current mirror; whereby the first and second clock switches form a complementary switch pair, i.e., whenever the first (second) is open, the second (first) is closed.

In another embodiment of the switching regulator, the first current mirror comprises a biasing transistor and a feedback transistor; wherein the biasing transistor and feedback transistor are PFET; wherein the source terminals of both transistors are electrically coupled to the power supply, the gate terminals to each other, the drain terminals to the second current mirror; and wherein the drain and gate terminals of the biasing transistor are electrically connected so that when the second switch is on, the pulled-up biasing voltage at the drain terminal of the biasing transistor will turn off the feedback transistor that in turn turns on the feedback sub-circuit to sink the current and pull down the biasing voltage.

In another embodiment of the switching regulator, the feedback sub-circuit comprises a draining transistor that is an NMOS, and an inverter; wherein the inverter is electrically coupled to the drain terminal of the feedback transistor and the gate terminal of the draining transistor; the draining terminal of the draining transistor is electrically coupled to the biasing voltage; and the source terminal to the ground; and wherein, when the second clock switch is on, the feedback transistor is turned off, then the low input of the inverter will turn on the draining transistor until the biasing voltage is pulled down enough to turn on the feedback transistor again.

In another embodiment of the switching regulator, the second current mirror comprises a first NMOS, a second NMOS, and a third NMOS forming a current mirror; wherein, for the first NMOS, its drain terminal is electrically coupled to the current source, its source terminal to the ground, and its gate terminal to the gate terminals of the second and third NMOSs; the drain and gate terminals of the first NMOS are electrically connected, forming a diode configuration; wherein, for the second NMOS, its drain terminal is electrically coupled to the drain terminal of the feedback transistor, and its source terminal to the ground; and wherein, for the third NMOS, its drain terminal is electrically coupled to the drain terminal of the biasing transistor, its source terminal to the ground for draining any current from the gate terminal of the output transistor.

In another embodiment of the present invention, there is provided a method for fast switching of a current mirror so as to provide a fast-switched large current to a load. In the embodiment, the method comprises turning off an output transistor that is a large size to source a large current output by electrically coupling the gate terminal to a power supply and disconnecting the gate terminal from a fast switching circuit; and turning on the output transistor by electrically coupling the gate terminal of the output transistor to the fast switching circuit and disconnecting the gate terminal from the power supply; wherein the fast switching circuit comprises a current source for providing a mirrored current as a reference bias current to the output transistor; a first current mirror electrically coupled to the gate terminal of the output transistor when the output transistor is turned on, wherein the first current mirror is so configured that it provides the biasing voltage to the gate terminal of the output transistor; a feedback sub-circuit electrically coupled to the first current mirror, wherein the feedback sub-circuit is so configured that it will receive a feedback signal from the first current mirror to sink the current from the gate terminal of the output transistor; and a second current mirror electrically coupled to the output transistor, the current source, the first current mirror, and the feedback sub-circuit, wherein the second current mirror is so configured that it provides the current source to the output transistor and sinks the residual current from the gate terminal of the output transistor when its gate terminal is at the biasing voltage.

In another embodiment of the method, the first current mirror comprises a biasing transistor and a feedback transistor; wherein the biasing transistor and feedback transistor are PFET; wherein the source terminals of both transistors are electrically coupled to the power supply, the gate terminals to each other, the drain terminals to the second current mirror; and wherein the drain and gate terminals of the biasing transistor are electrically connected so that the pulled-up biasing voltage at the drain terminal of the biasing transistor will turn off the feedback transistor that in turn turns on the feedback sub-circuit to sink the current and pull down the biasing voltage.

In another embodiment of the method, the feedback sub-circuit comprises a draining transistor that is an NMOS, and an inverter; wherein the inverter is electrically coupled to the drain terminal of the feedback transistor and the gate terminal of the draining transistor; the draining terminal of the draining transistor is electrically coupled to the biasing voltage; and the source terminal to the ground; and wherein, when the feedback transistor is turned off, then the low input of the inverter will turn on the draining transistor until the biasing voltage is pulled down enough to turn on the feedback transistor again.

In another embodiment of the method, the second current mirror comprises a first NMOS, a second NMOS, and a third NMOS forming a current mirror; wherein, for the first NMOS, its drain terminal is electrically coupled to the current source, its source terminal to the ground, and its gate terminal to the gate terminals of the second and third NMOSs; the drain and gate terminals of the first NMOS are electrically connected, forming a diode configuration; wherein, for the second NMOS, its drain terminal is electrically coupled to the drain terminal of the feedback transistor, and its source terminal to the ground; and wherein, for the third NMOS, its drain terminal is electrically coupled to the drain terminal of the biasing transistor, its source terminal to the ground for draining any current from the gate terminal of the output transistor.

In another embodiment of the present invention, there is provided an electronic device. In the embodiment, the electronic device comprises a microprocessor with a computer-readable medium; and a fast switching current mirror circuit for providing a fast-switched large current to the microprocessor, comprising: an output transistor that is a large size to source a large current output; a current source configured to provide a mirrored current as a reference bias current to the output transistor; a first current mirror electrically coupled to the gate terminal of the output transistor, wherein the first current mirror is so configured that it provides the biasing voltage to the gate terminal of the output transistor; a feedback sub-circuit electrically coupled to the first current mirror, wherein the feedback sub-circuit is so configured that it will receive the feedback signal from the first current mirror to sink the current from the gate terminal of the output transistor; and a second current mirror electrically coupled to the output transistor, the current source, the first current mirror, and the feedback sub-circuit, wherein the second current mirror is so configured that it provides the current source to the output transistor and sinks the residual current from the gate terminal of the output transistor when its gate terminal is at the biasing voltage. In another embodiment, the fast switching current mirror circuit further comprises a first and a second clock switches for controlling the gate voltages of the output transistor.

In another embodiment of the electronic device, the output transistor is a PFET, wherein its source terminal is electrically coupled to a power supply, and its drain terminal to an input of the output current; wherein the first clock switch is electrically disposed between the power supply and the gate terminal of the output transistor; when the first clock switch is on, the output transistor is turned off for its gate voltage is pulled up to the power supply; and wherein the second clock switch is electrically disposed between the first current mirror and the gate terminal of the output transistor; when the second clock switch is on, the output transistor is turned on for its gate voltage is pulled down to the biasing voltage of the first current mirror; whereby the first and second clock switches form a complementary switch pair, i.e., whenever the first (second) is open, the second (first) is closed.

In another embodiment of the electronic device, the first current mirror comprises a biasing transistor and a feedback transistor; wherein the biasing transistor and feedback transistor are PFET; wherein the source terminals of both transistors are electrically coupled to the power supply, the gate terminals to each other, the drain terminals to the second current mirror; and wherein the drain and gate terminals of the biasing transistor are electrically connected so that when the second switch is on, the pulled-up biasing voltage at the drain terminal of the biasing transistor will turn off the feedback transistor that in turn turns on the feedback sub-circuit to sink the current and pull down the biasing voltage.

In another embodiment of the electronic device, the feedback sub-circuit comprises a draining transistor that is an NMOS, and an inverter; wherein the inverter is electrically coupled to the drain terminal of the feedback transistor and the gate terminal of the draining transistor; the draining terminal of the draining transistor is electrically coupled to the biasing voltage; and the source terminal to the ground; and wherein, when the second clock switch is on, the feedback transistor is turned off, then the low input of the inverter will turn on the draining transistor until the biasing voltage is pulled down enough to turn on the feedback transistor again.

In another embodiment of the electronic device, the second current mirror comprises a first NMOS, a second NMOS, and a third NMOS forming a current mirror; wherein, for the first NMOS, its drain terminal is electrically coupled to the current source, its source terminal to the ground, and its gate terminal to the gate terminals of the second and third NMOSs; the drain and gate terminals of the first NMOS are electrically connected, forming a diode configuration; wherein, for the second NMOS, its drain terminal is electrically coupled to the drain terminal of the feedback transistor, and its source terminal to the ground; and wherein, for the third NMOS, its drain terminal is electrically coupled to the drain terminal of the biasing transistor, its source terminal to the ground for draining any current from the gate terminal of the output transistor.

In another embodiment of the electronic device, the electronic device is a computer, notebook, PDA, or MP3 player.

BRIEF DESCRIPTION OF THE DRAWINGS

Preferred embodiments according to the present invention will now be described with reference to the Figures, in which like reference numerals denote like elements.

DETAILED DESCRIPTION OF THE INVENTION

The present invention may be understood more readily by reference to the following detailed description of certain embodiments of the invention.

Throughout this application, where publications are referenced, the disclosures of these publications are hereby incorporated by reference, in their entireties, into this application in order to more fully describe the state of art to which this invention pertains.

While embodiments of the present invention will be described in reference to the accompanying drawings, the specifics and details are provided for the sole purpose of illustrating selected embodiments of the present invention. It is to be appreciated that the present invention may be practiced without employing the specifics and details. Furthermore, certain variations of the specifics and details in the practice are permissible without deviation from the scope of the appended claims.

Figure 1:
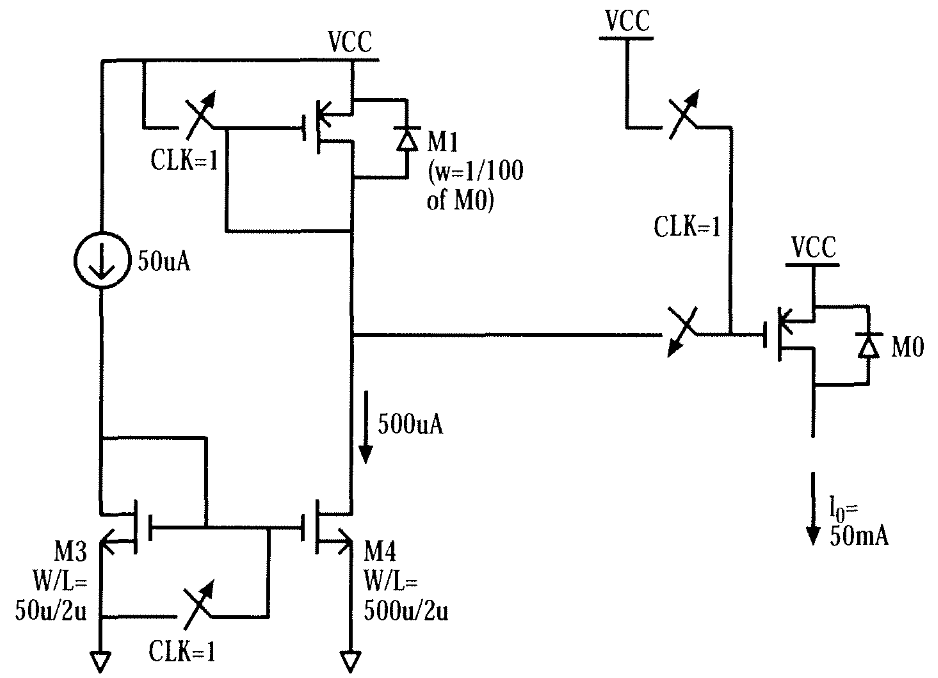
FIG 1 (PRIOR ART)
FIG. 1 shows the schematic diagram of a known current mirror circuit that has a large PFET providing a large output current of 50 mA at M0.
Figure 2:
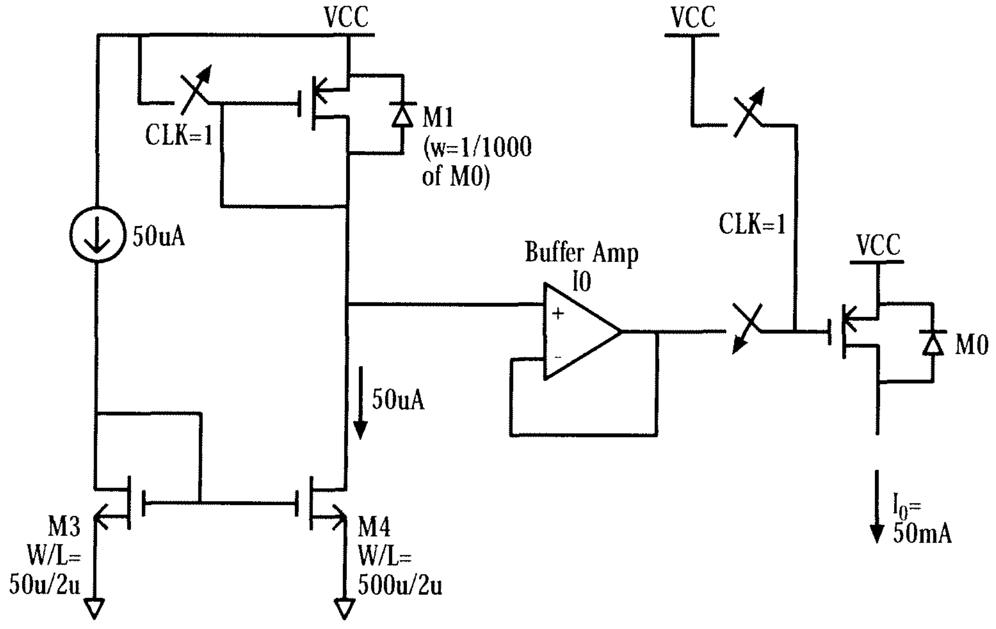
FIG 2 (PRIOR ART)
FIG. 2 shows the schematic diagram of another known current mirror circuit that has a large PFET providing a large output current of 50 mA at M0.
Figure 3:
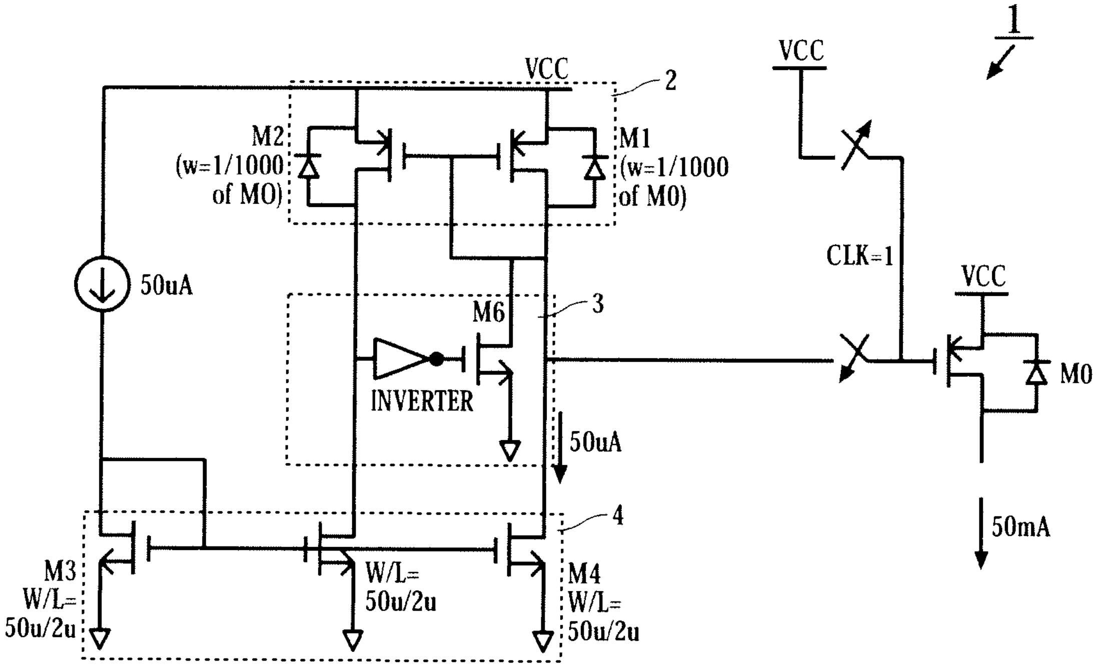
FIG. 3 shows the schematic diagram of a fast switching current mirror circuit in accordance with one embodiment of the present invention.

In one aspect, the present disclosure teaches a fast switching current mirror circuit with a large MOSFET size to provide a large output current to power a load. FIG. 3 shows a schematic diagram of the fast switching current mirror circuit in accordance with one embodiment of the present invention. The fast switching current mirror circuit 1 comprises an output transistor M0, a first current mirror 2 with a biasing transistor M1 and a feedback transistor M2, a draining module 3 with a current drain transistor M6 and an invertor, a current source, and a second current mirror 4 with M3, M4, M5.

The output transistor M0 is a PFET, where its source terminal is electrically coupled to the power supply VCC, its drain terminal to an input of the output current passing M0, and its gate terminal to two clock switches. A first clock switch is electrically coupled to the power supply VCC, and a second clock switch is electrically coupled to the junction formed by the drain terminals of M1 and M4, where the first and second clock switches form a complementary pair, i.e., whenever the first (second) is open, the second (first) is closed. M0 is usually a large size MOSFET. For example, the passing current is 50 mA.

The biasing transistor M1 is a PFET, where its source terminal is electrically coupled to the power supply VCC, its drain terminal to the drain terminal of M4, and its gate terminal to the gate terminal of M2. The gate and drain terminals of M1 is electrically coupled. The feedback transistor M2 is a PFET, wherein its source terminal is electrically coupled to the power supply VCC, its gate terminal to the gate terminal of M1, and its drain terminal to the drain terminal of M5. M1 and M2 form the first current mirror. M1 and M2 are sized 1000 times less than M0.

M3 is an NMOS, where its drain terminal is electrically coupled to the current source which in turn is electrically coupled to the power supply VCC, its source terminal to the ground, and its gate terminal to the gate terminals of M4 and M5. The current source provides a reference bias current to the output transistor. The drain and gate terminals of M3 are electrically connected, forming a diode configuration. M4 is an NMOS, where its drain terminal is electrically coupled to the drain terminal of M1, its source terminal to the ground, and its gate terminal to the gate terminals of M3 and M5. M5 is an NMOS, where its drain terminal is electrically coupled to the drain terminal of M2, its source terminal to the ground, and its gate terminal to the gate terminals of M3 and M4. M3, M4, and M5 form the second current mirror.

M6 is an NMOS, where its drain terminal is electrically coupled to the drain terminal of M1, its source terminal to the ground, and its gate terminal to the inverter which in turn is electrically coupled to the junction of the drain terminals of M2 and M5. The draining transistor and inverter form the draining module.

Now there is provided a brief description of the operation of the fast switching circuit as shown in FIG. 3. When CLK=0, the gate terminal of M0 is connected to the power supply VCC. Therefore, the gate capacitors are charged to VCC, resulting in no current passing the output transistor M0, i.e., M0 is turned off. When CLK=1, the gate terminal of M0 is connected to the junction of the drain terminals of M1 and M4, where the voltage at the junction is designated the biasing voltage Vb. However, as the gate capacitors of M0 are large and previously charged to VCC, the current drive of M4 cannot pull the voltage at the gate of M1 from VCC to Vb instantaneously. As a result, M2 is switched off and M5 will pull the input of the inverter towards ground. This feedback mechanism will cause M6 to turn on to the pull the gate of M0 towards ground until M2 is turned on again with its gate voltage at the biasing voltage Vb. When M2 is turned on, M6 will be turned off as the input of the inverter is pulled high. The gate voltage of M0 will then be at the biasing voltage Vb. The Vb can be preset by taking into consideration of the parameters of M3, M4 and M1.

Figure 4:
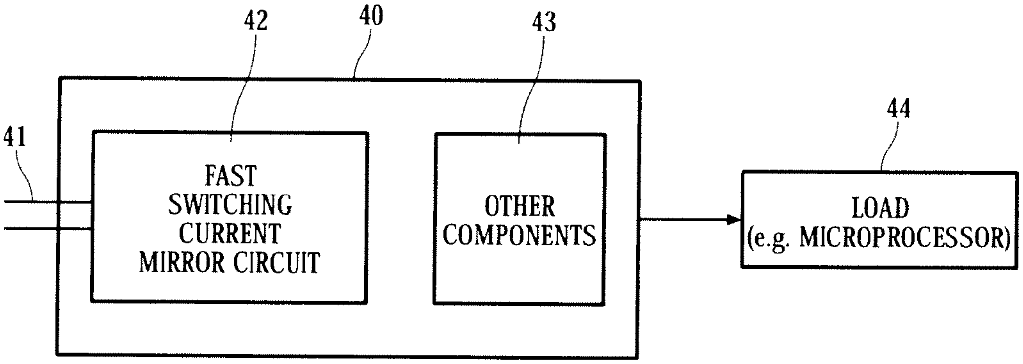
FIG. 4 is a block diagram illustrating an embodiment of the present invention comprising a system with a fast switching current mirror circuit.

Now referring to FIG. 4, there is provided a schematic diagram of a switching regulator comprising a fast switching current mirror circuit of the present invention. The switching regulator 40 comprises a fast switching current mirror circuit 42 that is controlled by the clock frequency signals 41, and other electronic components 43 that channel the current to the load such as microprocessors. The switching regulator 40 may be employed in any electronic devices operating from DC power supplies that require fast switching current mirrors. The common electronic devices include PDA, MP3 player, notebook, and computers.

It is to be noted that the fast switching current mirror circuit can be used in applications other than the switching regulator. For example, the fast switching current mirror circuit is applicable to any high side gate voltage limiting or controlling PFET current, e.g., motor driver full bridge circuitry, Switch-mode (e.g., buck, buck-boost, boost) regulator, and the like.

While the present invention has been described with reference to particular embodiments, it will be understood that the embodiments are illustrative and that the scopes of the appended claims are not so limited. Alternative embodiments of the present invention will become apparent to those having ordinary skill in the art to which the present invention pertains. Such alternate embodiments are considered to be encompassed within the scope of one or more of the appended claims. Accordingly, the scope of the present invention is described by the appended claims and is supported by the foregoing description.

What is claimed is:

1. A circuit for providing a switched current comprising:

a first current mirror having a power terminal coupled to a source of supply voltage, an input, and an output;

a second current mirror having an input for receiving an input current, a first output coupled to the output of the first current mirror, a second output coupled to the input of the first current mirror, and a power terminal coupled to ground;

a draining module having an input coupled to the output of the first current mirror, a first output coupled to the input of the first current mirror, and a second output coupled to ground; and an MOS output transistor having a gate coupled to the input of the first current mirror through a first switch and coupled to the source of supply voltage through a second switch, a first current terminal coupled to the source of supply voltage, and a second current terminal for providing the switched current.

2. The circuit of claim 1 wherein the first current mirror comprises a PMOS current mirror.

3. The circuit of claim 1 wherein the first current mirror comprises a first transistor one-thousandth the size of the output transistor.

4. The circuit of claim 3 wherein the first current mirror comprises a second transistor one-thousandth the size of the output transistor.

5. The circuit of claim 1 wherein the second current mirror comprises an NMOS current mirror.

6. The circuit of claim 1 wherein the draining module comprises:

an inverter having an input coupled to the input of the draining module, and an output; and a transistor having a gate coupled to the output of the inverter, a first current output coupled to the first output of the draining module, and a second current output coupled to the second output of the draining module.

7. The circuit of claim 6 wherein the transistor comprises an NMOS transistor.

8. The circuit of claim 1 wherein the input current is equal to 50 μA.

9. The circuit of claim 1 wherein the switched current is switched to 50 mA.

10. The circuit of claim 1 wherein the first current mirror comprises a unity gain current mirror.

11. The circuit of claim 1 wherein the second current mirror comprises a unity gain current mirror.

12. A circuit for providing a switched current comprising:

a first current mirror;

a second current mirror for receiving an input current having first and second outputs coupled to the first current mirror;

an inverter having an input coupled to the first output of the second current mirror, and an output;

a first transistor having a gate coupled to the output of the inverter, a drain coupled to the second output of the second current mirror, and a source coupled to ground; and a second transistor having a gate coupled to an input of the first current mirror through a first switch and coupled to a source of supply voltage through a second switch, a source coupled to the source of supply voltage, and a drain for providing the switched current, wherein the second transistor comprises an MOS transistor.

13. A circuit for providing a switched current comprising:

a first current mirror;

a second current mirror for receiving an input current having first and second outputs coupled to the first current mirror;

an inverter having an input coupled to the first output of the second current mirror, and an output;

a draining transistor having a gate coupled to the output of the inverter, a drain coupled to the second output of the second current mirror, and a source coupled to ground; and a switched MOS output transistor having a gate coupled to an input of the first current mirror, a source coupled to a source of supply voltage, and a drain for providing the switched current.

* * * * *